United States Patent
Suzuki et al.

(10) Patent No.: US 9,645,390 B2
(45) Date of Patent: May 9, 2017

(54) SPATIAL LIGHT MODULATOR AND EXPOSURE APPARATUS

(71) Applicant: Nikon Corporation, Tokyo (JP)

(72) Inventors: Junji Suzuki, Tama (JP); Yoshihiko Suzuki, Funabashi (JP)

(73) Assignee: Nikon Corporation, Tokyo (JP)

( * ) Notice: Subject to any disclaimer, the term of this patent is extended or adjusted under 35 U.S.C. 154(b) by 156 days.

(21) Appl. No.: 14/588,841

(22) Filed: Jan. 2, 2015

(65) Prior Publication Data
US 2015/0116684 A1 Apr. 30, 2015

Related U.S. Application Data

(63) Continuation of application No. PCT/JP2013/003816, filed on Jun. 19, 2013.

(30) Foreign Application Priority Data

Jul. 2, 2012 (JP) .................. 2012-148813

(51) Int. Cl.
*G02B 26/08* (2006.01)
*G03F 7/20* (2006.01)

(52) U.S. Cl.
CPC ..... *G02B 26/0841* (2013.01); *G03F 7/70058* (2013.01); *G03F 7/70116* (2013.01)

(58) Field of Classification Search
None
See application file for complete search history.

(56) References Cited

U.S. PATENT DOCUMENTS 5,330,878 A * 7/1994 Nelson ............... G03F 7/2057
430/311
5,629,794 A 5/1997 Magel et al.
(Continued)

FOREIGN PATENT DOCUMENTS

CN 101029965 9/2007
CN 101120278 2/2008
(Continued)

OTHER PUBLICATIONS

Notice of Reasons for Rejection for Japanese Application No. 2012-148813, dated May 17, 2016, 4 pages (with English translation).

(Continued)

*Primary Examiner* — Steven H Whitesell Gordon
(74) *Attorney, Agent, or Firm* — Klarquist Sparkman, LLP

(57) ABSTRACT

The spatial light modulator is provided with: a substrate; a fixed electrode disposed on a surface of the substrate; a connecting section, which has one end of the connecting section connected to the surface of the substrate; a movable section, which is connected to another end of the connecting section; a supporting post section, which extends in the thickness direction of the substrate with one end of the supporting post section connected to the movable section; a reflecting member, which is connected to another end of the supporting post section; a movable electrode, which is disposed on a surface of the reflecting member, the surface of the reflecting member facing the fixed electrode; and a conductive layer, which is disposed on the supporting post section with a film thickness larger than that of the movable electrode, and which electrically connects between the movable section and the movable electrode.

11 Claims, 18 Drawing Sheets

(56) References Cited

U.S. PATENT DOCUMENTS

| | | | | |
|---|---|---|---|---|
| 5,650,881 | A | * | 7/1997 | Hornbeck ............. B81B 3/0072 348/771 |
| 7,428,092 | B2 | | 9/2008 | Lee et al. |
| 7,969,639 | B2 | | 6/2011 | McNie et al. |
| 2002/0122159 | A1 | | 9/2002 | Choi |
| 2004/0061961 | A1 | * | 4/2004 | Valette .................. B81B 3/0062 359/872 |
| 2004/0114110 | A1 | * | 6/2004 | Shin ........................ G03B 21/28 353/31 |
| 2008/0084603 | A1 | * | 4/2008 | Song ........................ G02F 1/167 359/296 |
| 2008/0123176 | A1 | * | 5/2008 | DiCarlo ............. G02B 26/0833 359/291 |
| 2008/0137170 | A1 | * | 6/2008 | Rothenbury ....... G02B 26/0833 359/290 |
| 2009/0231671 | A1 | * | 9/2009 | Yang .................. G02B 26/0841 359/291 |
| 2014/0168751 | A1 | * | 6/2014 | Suzuki ................... G02B 26/08 359/291 |

FOREIGN PATENT DOCUMENTS

| | | |
|---|---|---|
| CN | 101416081 | 4/2009 |
| JP | H09-101467 A | 4/1997 |
| JP | 2002-277769 | 9/2002 |
| JP | 2003-156699 A | 5/2003 |
| JP | 2011-170299 A | 9/2011 |
| KR | 2003-0030225 | 4/2003 |

OTHER PUBLICATIONS

International Search Report from International Application No. PCT/JP2013/003816, dated Jul. 16, 2013, 4 pages.

Notice of Preliminary Rejection from related Korean Application No. 10-2015-7002678, dated Jan. 20, 2016, 10 pages (with English translation).

Notification of the First Office Action from Chinese Patent Application No. 201380032513.4, dated Feb. 23, 2016, 11 pages (with English translation).

International Preliminary Report on Patentability from International Application No. PCT/JP2013/003816, dated Jan. 6, 2015, 2 pages.

Written Opinion from International Application No. PCT/JP2013/003816, dated Jul. 16, 2013, 5 pages.

Second Office Action from Chinese Patent Application No. 201380032513.4, dated Jul. 22, 2016, 11 pages (with English translation).

Notice of Final Rejection from Korean Patent Application No. 10-2015-7002678, dated Jul. 26, 2016, 8 pages (with English translation).

Notice of Reasons for Rejection from Japanese Application No. 2012-148813, dated Nov. 1, 2016, 2 pages (with English translation).

Third Office Action from Chinese Application No. 201380032513.4, dated Dec. 2, 2016, 11 pages (with English translation).

* cited by examiner

SPATIAL LIGHT MODULATOR AND EXPOSURE APPARATUS

CROSS REFERENCE TO RELATED APPLICATIONS

This application is a continuation of International Application No. PCT/JP2013/003816, filed Jun. 19, 2013, which claims the benefit of Japanese Application No. JP 2012-148813, filed Jul. 2, 2012, both of which are incorporated herein by reference.

BACKGROUND

1. Technical Field

The present invention relates to a spatial light modulator and an exposure apparatus.

2. Related Art

There are spatial light modulators manufactured with a lithography technique, and using electrostatic force to drive mirrors supported by torsion hinges (see Japanese Unexamined Patent Application Publication No. H09-101467A).

SUMMARY

Since spatial light modulators have a three-dimensional structure which supports mirrors detached above a substrate, there are cases in the manufacturing processes where a favorable electrical connection is not formed between the substrate and the mirrors.

According to a first aspect of the present invention, there is provided a spatial light modulator provided with a substrate, a fixed electrode disposed on a surface of the substrate, a connecting section, which has one end of the connecting section connected to the surface of the substrate, a movable section, which is connected to another end of the connecting section, and which swings with respect to the substrate due to elastic deformation of the connecting section, a supporting post section, which extends in a thickness direction of the substrate with one end of the supporting post section connected to the movable section, and which integrally swings with the movable section, a reflecting member, which is connected to another end of the supporting post section, and which has a reflecting surface that integrally swings with the movable section and the supporting post section, a movable electrode, which is disposed on a surface of the reflecting member, the surface of the reflecting member facing the fixed electrode, and a conductive layer, which is disposed on the supporting post section with a film thickness larger than that of the movable electrode, and which electrically connects between the movable section and the movable electrode.

According to a second aspect of the present invention, there is provided a spatial light modulator provided with a substrate, a fixed electrode disposed on the surface of the substrate, a connecting section, which has one end of the connecting section connected to the surface of the substrate, a movable section, which is connected to another end of the connecting section, and which swings with respect to the substrate due to elastic deformation of the connecting section, a reflecting member, which includes a semiconductor layer and which has a reflecting surface that integrally swings with the movable section, a metal layer adjacent to the semiconductor layer, and an ohmic contact section which creates an ohmic contact between the semiconductor layer and the metal layer.

According to a third aspect of the present invention, there is provided a spatial light modulator provided with a substrate, a connecting section, which has one end of the connecting section connected to a surface of the substrate, a movable section, which is connected to another end of the connecting section, and which swings with respect to the substrate with the connecting section as a swinging axis due to elastic twisting deformation of the connecting section, a reflecting member which integrally swings with the movable section, a movable electrode, which is disposed on a surface of the reflecting member, the surface of the reflecting member facing the surface of the substrate, and a fixed electrode disposed on the surface of the substrate in a region facing the movable electrode without being blocked by the connecting section and the movable section.

As a fourth aspect of the present invention, there is provided an exposure apparatus provided with the spatial light modulator described above.

The summary of the invention described above does not necessarily describe all necessary features of the embodiments of the present invention. In addition, another combination of the features described above may also be used as the present invention.

DESCRIPTION OF EXEMPLARY EMBODIMENTS

Hereinafter, the present invention will be described according to some embodiments of the invention. The below embodiments do not limit the invention according to the claims. In addition, it is not the case that all the combinations of the features described in the embodiments are essential to the solving means of the invention.

Figure 1:
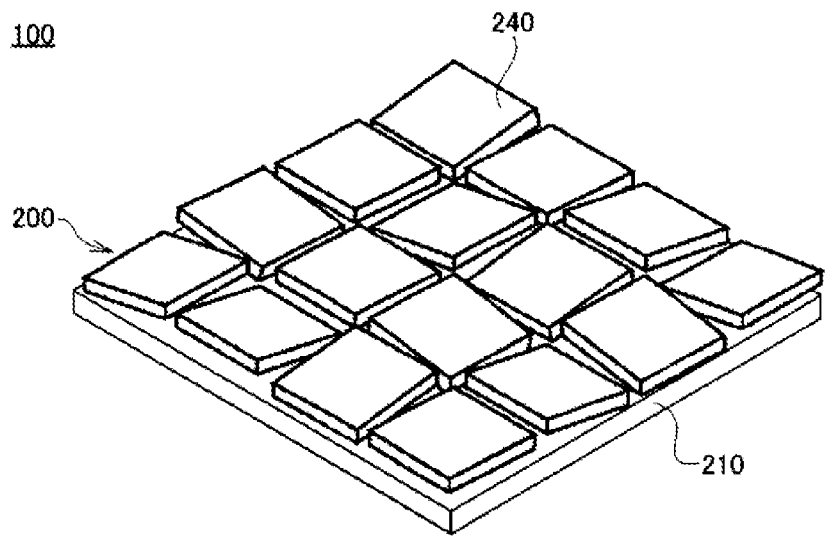
FIG. 1 is a schematic view showing an external appearance of a spatial light modulator 100.

FIG. 1 is a schematic perspective view showing an external appearance of a spatial light modulator 100. The spatial light modulator 100 is provided with a substrate 210 and reflecting sections 240.

A plurality of the reflecting sections 240 is lined up two-dimensionally on the substrate 210 to form a matrix. Each of the reflecting sections 240 has a square reflecting surface where one side is several µm to one hundred and several tens of µm and is a part of the spatial light modulation element 200 which swings individually with respect to the substrate 210.

As shown in the diagrams, when light is reflected by the spatial light modulator 100 in a state where the reflecting sections 240 are inclined by being swung differently to each other, illumination distributions occur in the reflected light. Thus, it is possible to form various illumination distributions in the reflected light by controlling the swinging of the reflecting sections 240.

Figure 2:
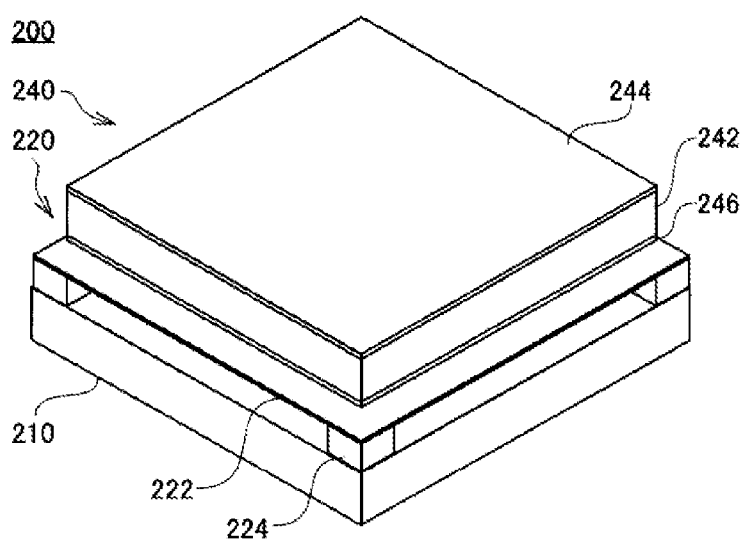
FIG. 2 is a perspective view showing an external appearance of a single spatial light modulation element 200.

FIG. 2 is a perspective view extracting and showing a single spatial light modulation element 200. The spatial light modulation element 200 has a structure where two layers are laminated on the substrate 210.

The lower layer side of the structure on the substrate 210 has a shielding section 220 including a shielding plate 222 and supporting posts 224. The shielding plate 222 is disposed along four sides of the spatial light modulation element 200. The supporting posts 224 support the shielding plate 222 on the substrate 210. Due to this, the shielding plate 222 is fixed with respect to the substrate 210 in a state of surrounding the spatial light modulation element 200 and prevents electromagnetic interference with the adjacent spatial light modulation element 200 in the spatial light modulator 100.

In addition, in a case where the plurality of spatial light modulation elements 200 is disposed to be adjacent in the spatial light modulator 100 shown in FIG. 1, it is possible for the shielding plate 222 to interrupt light entering toward the substrate 210 from between the reflecting sections 240 which are adjacent to each other. Due to this, it is possible to suppress heating of the substrate 210 due to radiation light.

The upper layer side of the structure on the substrate 210 has the reflecting sections 240 including a support layer 242, a reflecting layer 244, and a movable electrode 246. The upper surface of the support layer 242 in the diagram is a flat surface, which supports the reflecting layer 244. The movable electrode 246 is disposed on the lower surface of the support layer 242 in the diagram. The reflecting sections 240 are supported from the substrate 210 to swing freely as a whole with respect to the substrate 210.

Figure 3:
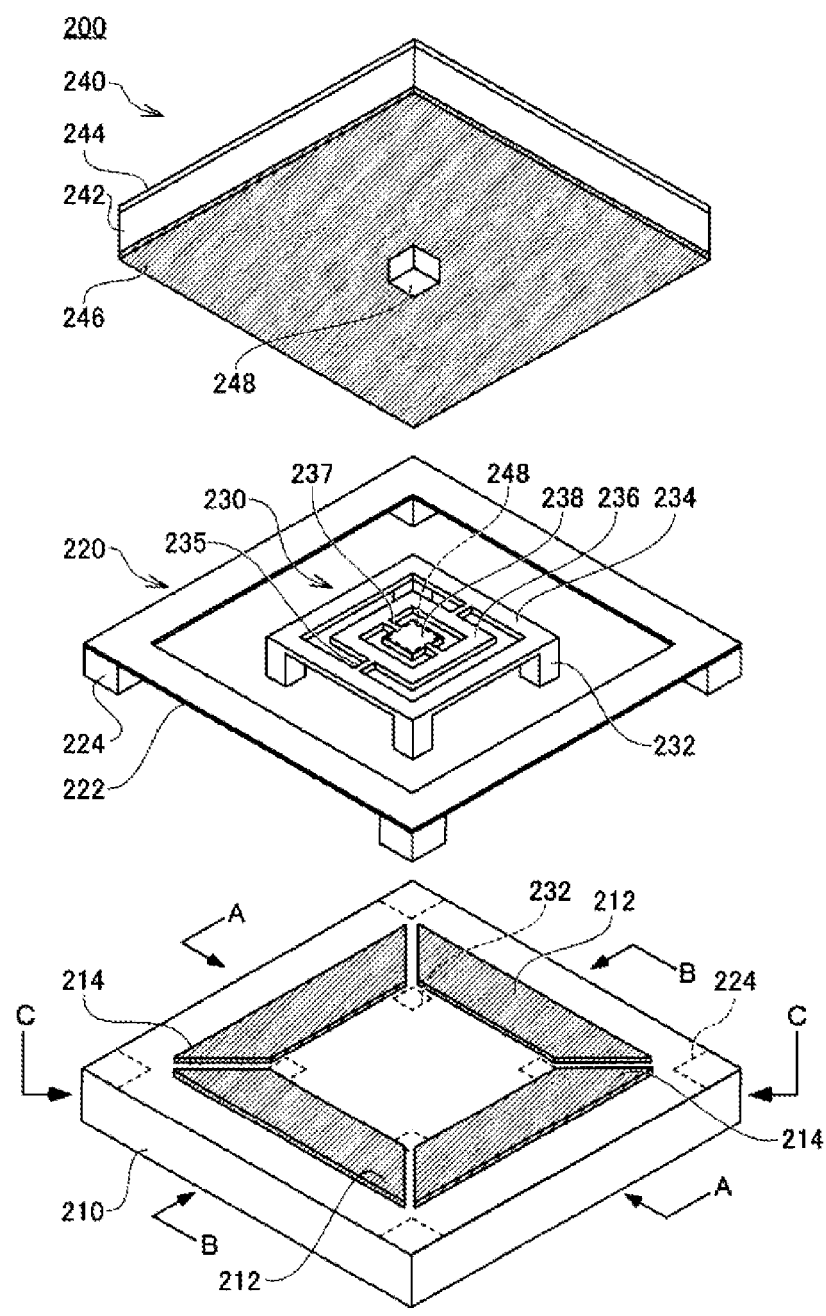
FIG. 3 is an exploded perspective view of the spatial light modulation element 200.

FIG. 3 is a schematic exploded perspective view showing the structure of the spatial light modulation element 200. The same reference numerals are given to elements in common with FIG. 1 and FIG. 2 and redundant description thereof will be omitted.

The spatial light modulation element 200 is provided with the substrate 210, the shielding section 220, a gimbal section 230, and the reflecting section 240. The shielding section 220 and the gimbal section 230 are fixed on the upper surface of the substrate 210. The reflecting section 240 is attached with respect to the gimbal section 230.

Two pairs of fixed electrodes 212 and 214, which have the same shape as each other, are disposed on the substrate 210. The substrate 210 is formed of, for example, a silicon single crystal, and includes a CMOS circuit for supplying driving power to the fixed electrodes 212 and 214. The fixed electrodes 212 and 214 are formed of a conductive material such as metal and are disposed symmetrically with respect to the center of the substrate 210 in parallel with the four sides of the substrate 210.

The shielding section 220 has the shielding plate 222 disposed along the four sides of the substrate 210 and the supporting posts 224 which support the shielding plate 222.

The shielding plate 222 is disposed along the four sides of the substrate 210 on the outside of the region in which the fixed electrodes 212 and 214 are disposed. In addition, the supporting posts 224 are disposed at the four corners of the substrate 210 further to the outside than the region in which the fixed electrodes 212 and 214 are disposed on the surface of the substrate 210.

Here, the substrate 210 in the spatial light modulation element 200 is the part of the substrate 210 which forms the spatial light modulator 100. Thus, although the substrate 210 does not necessarily have the shape in the diagrams, in a case of focusing on a single spatial light modulation element 200, the shape of the substrate 210 which makes up the spatial light modulation element 200 is a rectangle slightly larger than the reflecting section 240 as in the diagrams.

The gimbal section 230 has supporting posts 232, a secured frame 234, a movable frame 236, and a swing section 238, and is disposed inwards of the region in which the fixed electrodes 212 and 214 are disposed on the surface of the substrate 210. The supporting posts 232 fix the secured frame 234 with respect to the substrate 210 at the four corners of the gimbal section 230 itself.

The movable frame 236 is disposed in the secured frame 234 to be concentric with the secured frame 234 and connected with the secured frame 234 by torsion shaft sections 235. The movable frame 236 swings with respect to the secured frame 234 due to elastic torsional deformation of the torsion shaft sections 235.

The swing section 238 is disposed in the movable frame 236 to be concentric with the secured frame 234 and the movable frame 236 and is connected with the movable frame 236 by torsion shaft sections 237. The swing section 238 swings with respect to the movable frame 236 due to elastic torsional deformation of the torsion shaft sections 237. Thus, by combining the swinging of the movable frame 236 itself and the swinging of the swing section 238 with respect to the movable frame 236, it is possible to incline the swing section 238 in any direction with respect to the substrate 210.

Here, the swing section 238 swings due to elastic deformation of the torsion shaft sections 235 and 237. Thus, it is preferable that the torsion shaft sections 235 which swing the movable frame 236 with respect to the secured frame 234 and the torsion shaft sections 237 which swing the swing section 238 with respect to the movable frame 236 be formed with the same materials, the same shapes, and the same dimensions. Due to this, the load is stabilized in a case where the swing section 238 swings and the controllability of the spatial light modulation element 200 is improved.

The reflecting section 240 has a supporting post 248 in the center of the lower surface of the support layer 242 on which the movable electrode 246 is provided. The lower end of the supporting post 248 whose upper end is connected with the support layer 242 is connected with the swing section 238 of the gimbal section 230. Due to this, it is possible to support the reflecting section 240 on the substrate 210 in a state where it is possible to incline the reflecting section 240 in any direction with respect to the substrate 210.

Here, in the spatial light modulation element 200 described above, the gimbal section 230 is disposed at the same height as the shielding section 220 with respect to the substrate 210. Thus, in a case where the spatial light modulation element 200 is manufactured with a lithography technique, it is possible to form the gimbal section 230 and the shielding section 220 in parallel.

With an object of having the shielding section 220 exhibit an electromagnetic shielding function and an object of having the gimbal section 230 make the circuit and the movable electrode on the substrate 210 electrically conductive, it is preferable that both the gimbal section 230 and the shielding section 220 be formed of conductors. Thus, it is preferable that the shielding section 220 and the gimbal section 230 be formed of a conductive material such as a metal such as a TiAl alloy.

On the other hand, it is preferable that the support layer 242 of the reflecting section 240 be lightweight with high rigidity. Thus, for example, it is possible to form the support layer 242 of an oxide, a nitride, a carbide deposited as a thin film. Furthermore, the support layer 242 may be formed of amorphous silicon. Since it is possible for the amorphous silicon to film-form a thick thin film at a low temperature, it is possible to form the support layer 242 having a high bending rigidity while being lightweight without causing damage to the existing structure.

It is possible for the reflecting layer 244 to be formed of a metal film, a dielectric multilayer film, or the like laminated as a thin film on the support layer 242. In a case of forming the reflecting layer 244, the surface of the support layer 242 which is a base may be flattened with high precision by being mirror-polished in advance.

It is possible for the movable electrode 246 to be formed of a conductive material such as metal. In a case where the support layer 242 is formed of amorphous silicon, it is also possible to set the support layer 242 itself as the movable electrode 246. However, it is also possible to improve the electrical characteristics as an electrode by forming the movable electrode 246 of metal. In addition, by making the movable electrode 246 out of metal, it is possible to balance thermal stress, which is a cause of warping in the reflecting section 240, at the front and back of the support layer 242 and to suppress deformation of the reflecting section 240.

Figure 4:
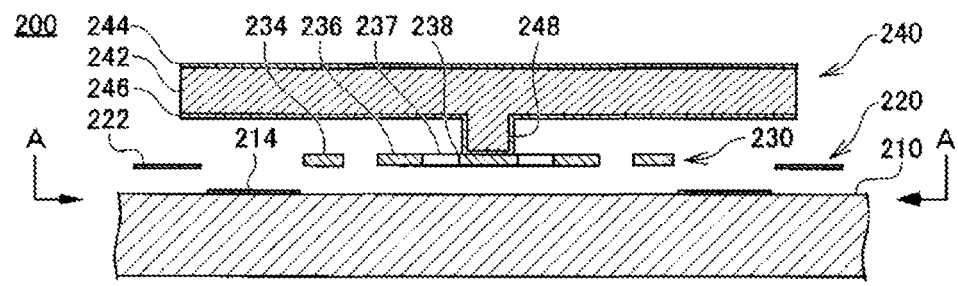
FIG. 4 is a cross-sectional view of the spatial light modulation element 200.

FIG. 4 is a schematic cross-sectional view of the spatial light modulation element 200 showing a cross-section A-A shown in FIG. 3. The same reference numerals are given to elements in common with FIG. 3 and redundant description thereof will be omitted.

On the substrate 210 of the spatial light modulation element 200, the shielding plate 222 is disposed further to the edge side than the fixed electrode 214. In addition, the gimbal section 230 is disposed further to the center of the substrate 210 than the fixed electrodes 214.

Thus, the shielding plate 222, the secured frame 234, the movable frame 236, and the like do not overlap with the fixed electrodes 214 in a direction perpendicular to the substrate 210. Due to this, the entirety of the surfaces of the fixed electrodes 214 face the movable electrode 246, which is positioned above in the diagrams.

Figure 5:
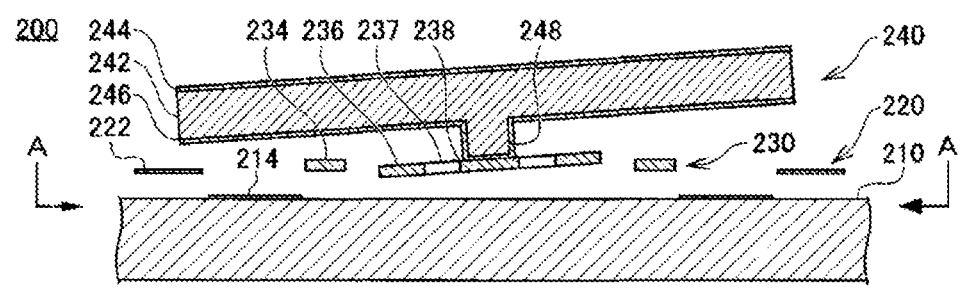
FIG. 5 is a cross-sectional view of the spatial light modulation element 200.

FIG. 5 is a schematic cross-sectional view of the spatial light modulation element 200 and, in the same cross-section as FIG. 4, shows a state where driving power is supplied to the fixed electrodes 214 positioned on the left side in the diagram. Electrostatic force acts between the fixed electrode 214 to which driving power is applied and the movable electrode 246, and the reflecting section 240 is drawn toward the fixed electrode 214 along with the movable electrode 246. Due to this, the torsion shaft sections 235 deform and the entirety of the reflecting section 240 swings.

Figure 6:
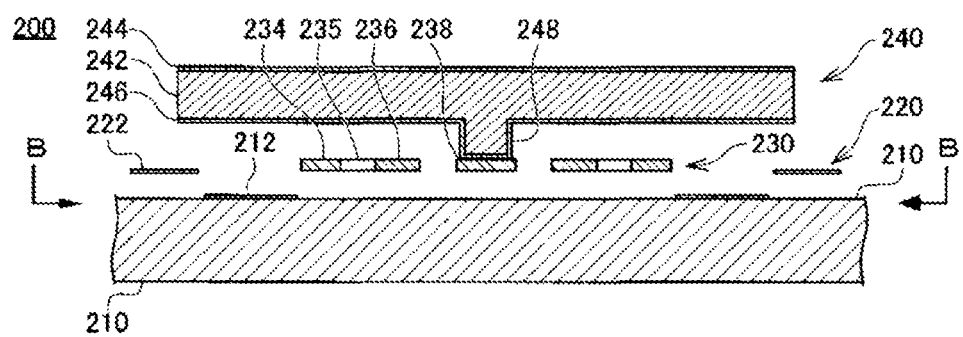
FIG. 6 is a cross-sectional view of the spatial light modulation element 200.

FIG. 6 is a schematic cross-sectional view of the spatial light modulation element 200 and shows a cross-section B-B shown in FIG. 3. The same reference numerals are given to elements in common with FIG. 3 and redundant description thereof will be omitted.

On the substrate 210 of the spatial light modulation element 200, the shielding plate 222 is disposed further to the edge sides than the fixed electrodes 212. In addition, the gimbal section 230 is disposed further to the center of the substrate 210 than the fixed electrodes 212.

Thus, the shielding plate 222, the secured frame 234, the movable frame 236, and the like do not overlap with the fixed electrodes 212 in a direction perpendicular to the substrate 210. Due to this, the entirety of the surfaces of the fixed electrodes 212 face the movable electrode 246 which is positioned above in the diagram.

Figure 7:
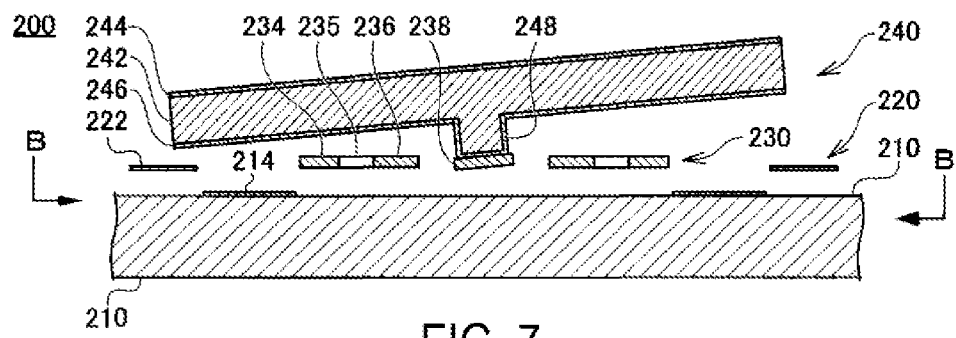
FIG. 7 is a cross-sectional view of the spatial light modulation element 200.

FIG. 7 is a schematic cross-sectional view of the spatial light modulation element 200 and, in the same cross-section as FIG. 6, shows a state where driving power is supplied to the fixed electrodes 212 positioned on the left side in the diagram. Electrostatic force acts between the fixed electrode 212 to which driving power is applied and the movable electrode 246, and the reflecting section 240 is drawn toward the fixed electrode 214 along with the movable electrode 246. Due to this, the torsion shaft sections 237 deform and the entirety of the reflecting section 240 swings.

As described above, in the spatial light modulation element 200, it is possible to make the reflecting section 240 swing by applying driving power to either of the fixed electrodes 212 and 214. In addition, it is possible to change to any inclination direction of the reflecting section 240 by simultaneously applying driving power to a pair of the fixed electrodes 212 and 214 adjacent to each other out of the fixed electrodes 212 and 214. Due to this, it is possible for the spatial light modulation element 200 to electrically control the inclination of the reflecting layer 244 of the reflecting section 240 with respect to the substrate 210.

In addition, in the spatial light modulation element 200 driven by electrostatic force, the interval between the fixed electrodes 212 and 214 and the movable electrode 246 is greater than the interval at which it is possible for the electrodes to come into direct contact. Thus, the pull-in phenomenon where the movable electrode 246 is adhered to the side of the fixed electrodes 212 and 214 is avoided. In the spatial light modulation element 200, since the movable electrode 246 is disposed on the lower surface of the reflecting section 240 which is separated from the substrate 210, the margin until the pull-in phenomenon occurs is large. In other words, the range where it is possible to swing the reflecting section 240 without the pull-in phenomenon occurring is widened.

Furthermore, in the spatial light modulation element 200, each of the torsion shaft sections 235 and 237 is disposed outside an electric field formed between the fixed electrodes 212 and 214 and the movable electrode 246. Thus, the influence of electrostatic force with respect to the torsion shaft sections 235 and 237 is suppressed and the movable frame 236, the swing section 238, and the reflecting section 240 suspended by the torsion shaft sections 235 and 237 are suppressed from being pulled down due to the electrostatic force.

Furthermore, in the spatial light modulation element 200, since the reflecting section 240 is driven by the fixed electrodes 212 and 214 disposed in the vicinity of the outer edges of the substrate 210, it is possible to efficiently drive the reflecting section 240 using the driving power applied to the fixed electrodes 212 and 214. Furthermore, since the fixed electrodes 212 and 214 which have the same shapes and areas as each other are symmetrically disposed, the driving conditions of the fixed electrodes 212 and 214 are equal and it is possible to drive the reflecting section 240 with good controllability.

Referring again to FIG. 1, it is possible to individually control the inclination of the plurality of reflecting sections 240 in the spatial light modulator 100 by controlling the driving power applied to the individual spatial light modulation elements 200. In addition, in individual spatial light modulation elements 200, since the mutual electromagnetic interference with the other adjacent spatial light modulation elements 200 is interrupted by the shielding section 220, the operation of the individual spatial light modulation elements 200 is stabilized. Thus, since it is possible to form any irradiation pattern by the reflecting in the spatial light modulator 100, it is possible to use the spatial light modulator 100 as a variable light source, an exposure apparatus, an image display apparatus, a light switch, or the like.

FIG. 8 to FIG. 24 are cross-sectional views showing manufacturing processes of the spatial light modulation element 200.

Here, FIG. 8 to FIG. 23 depict a cross-section shown by arrow C in FIG. 3. For this reason, the supporting posts 224 and 232 of the shielding section 220 and the gimbal section 230 appear in the cross-section shown in the diagrams; however, the torsion shaft sections 235 and 237 of the fixed electrodes 212 and 214 and the gimbal section 230 on the substrate 210 do not appear.

In addition, since FIG. 8 to FIG. 22 show production processes, there are cases where the corresponding elements in the spatial light modulation element 200 are included in a shape different to the diagrams up to FIG. 7. Then, in each of the diagrams showing the production processes, description is given by giving individual reference numerals to each of the elements and description is given of the correspondence relationship between elements of the spatial light modulation element 200 at a stage where the spatial light modulation element 200 is completed in FIG. 23.

Figure 8:
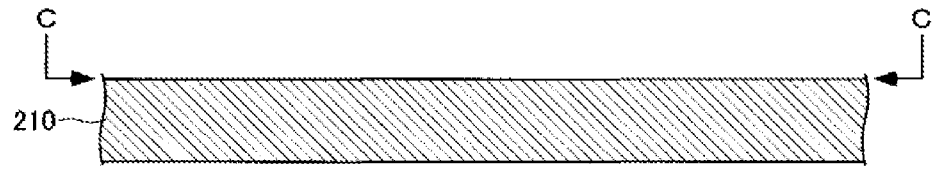
FIG. 8 is a cross-sectional view of the spatial light modulation element 200 in a manufacturing process.

First, the flat substrate 210 is prepared as shown in FIG. 8. As the material of the substrate 210, it is possible to use a wide range of members having a flat surface such as compound semiconductor substrates and ceramic substrates in addition to the silicon single crystal substrate.

Here, a CMOS circuit for supplying driving power to the fixed electrodes 212 and 214 is already formed on the substrate 210. In addition, the fixed electrodes 212 and 214 which do not appear in the C—C cross-section are already formed on the substrate 210.

The fixed electrodes 212 and 214 are formed, for example, by depositing metals such as aluminum or copper on the substrate 210 using a physical vapor deposition method, a chemical vapor deposition method, a plating method, or the like. In addition, it is possible for the metal layer deposited on the substrate 210 to be patterned in the shape of the fixed electrodes 212 and 214 using a resist.

Figure 9:
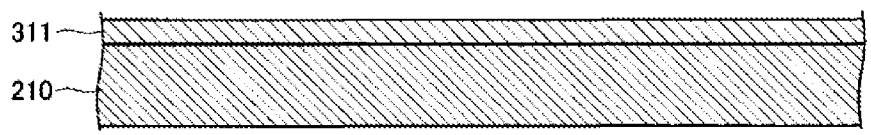
FIG. 9 is a cross-sectional view of the spatial light modulation element 200 in a manufacturing process.

Next, as shown in FIG. 9, a first sacrificial layer 311 is formed on the substrate 210 by depositing a resist material up to a thickness which buries the fixed electrodes 212 and 214. The thickness of the first sacrificial layer 311 corresponds to the height of the supporting posts 224 and 232 of the shielding section 220 and the gimbal section 230 in the spatial light modulation element 200. It is possible to form the first sacrificial layer 311 by coating and pre-baking a resist material using spin coating, spray coating, or the like. Due to this, the surface of the substrate 210 is flattened.

Figure 10:
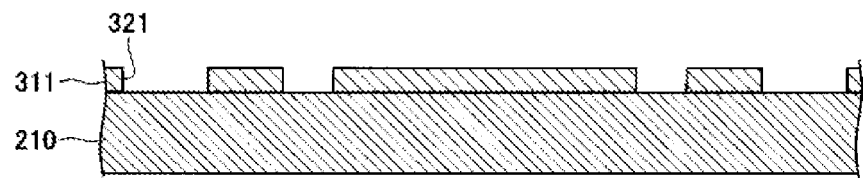
FIG. 10 is a cross-sectional view of the spatial light modulation element 200 in a manufacturing process.

Subsequently, as shown in FIG. 10, the first sacrificial layer 311 is patterned. It is possible to pattern the first sacrificial layer 311 by sequentially executing exposure, development, and pre-baking with respect to the coated resist material. In addition, the resist material may be processed by a dry etching method such as plasma etching.

A contact hole 321 which passes through to the surface of the substrate 210 is formed in the first sacrificial layer 311 by patterning. The contact hole 321 is formed in a region where the supporting posts 224 and 232 of the shielding section 220 and the gimbal section 230 are disposed.

Figure 11:
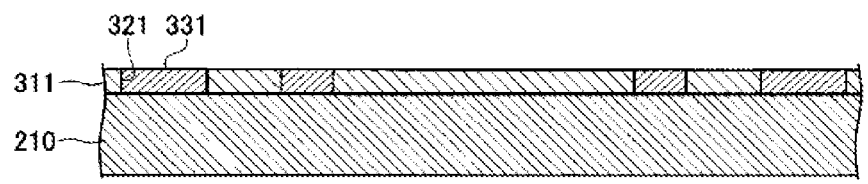
FIG. 11 is a cross-sectional view of the spatial light modulation element 200 in a manufacturing process.

Next, as shown in FIG. 11, a first metal layer 331 which is a part of the supporting posts 224 and 232 of the shielding section 220 and the gimbal section 230 is formed by depositing the metal and filling in the contact hole 321. It is possible to form the first metal layer 331, for example, by depositing a metal material such as a TiAl alloy using a physical vapor deposition method, a chemical vapor deposition method, a plating method, or the like.

Figure 12:
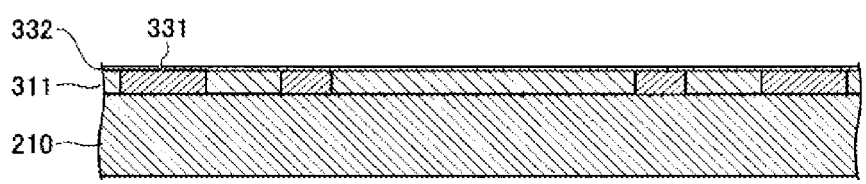
FIG. 12 is a cross-sectional view of the spatial light modulation element 200 in a manufacturing process.

Next, as shown in FIG. 12, a second metal layer 332 is formed over the entire surface of the first metal layer 331 and the first sacrificial layer 311. It is possible to form the second metal layer 332, for example, by depositing a metal material such as a TiAl alloy using a physical vapor deposition method, a chemical vapor deposition method, a plating method, or the like.

Figure 13:
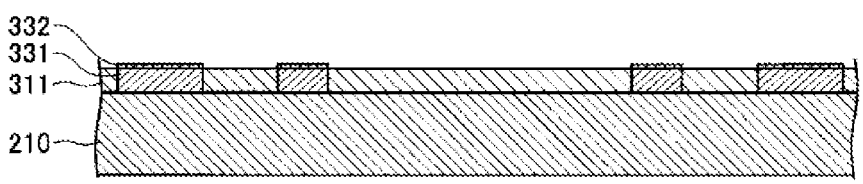
FIG. 13 is a cross-sectional view of the spatial light modulation element 200 in a manufacturing process.

Subsequently, the second metal layer 332 is patterned as shown in FIG. 13. It is possible to appropriately select various types of dry etching or wet etching as the patterning method of the second metal layer 332. In this manner, each of the patterns of the existing first metal layer 331 is incrementally stacked and the shielding plate 222 which does not appear in the cross-section in the diagrams is formed.

Figure 14:
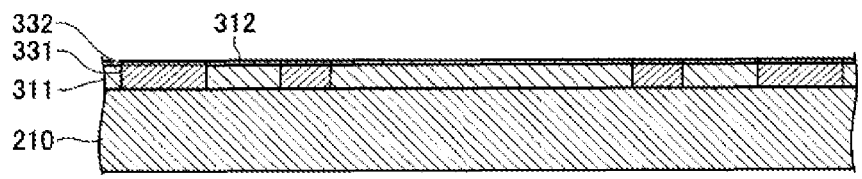
FIG. 14 is a cross-sectional view of the spatial light modulation element 200 in a manufacturing process.

Next, as shown in FIG. 14, a second sacrificial layer 312 is deposited on the surface of the first sacrificial layer 311 exposed through the remaining second metal layer 332, and the entire surface is flattened. The second sacrificial layer 312 is also formed by coating and pre-baking the resist material using spin coating, spray coating, or the like.

Figure 15:
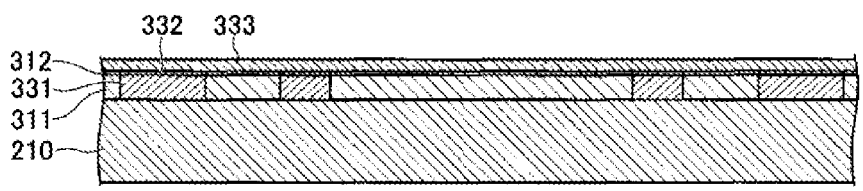
FIG. 15 is a cross-sectional view of the spatial light modulation element 200 in a manufacturing process.

Furthermore, as shown in FIG. 15, a third metal layer 333 which is the secured frame 234, the movable frame 236, and the swing section 238 of the gimbal section 230 is formed by depositing a metal over the entire surface of the second metal layer 332 and the second sacrificial layer 312. It is possible to form the third metal layer 333, for example, by depositing a metal material such as a TiAl alloy using a physical vapor deposition method, a chemical vapor deposition method, a plating method, or the like.

Figure 16:
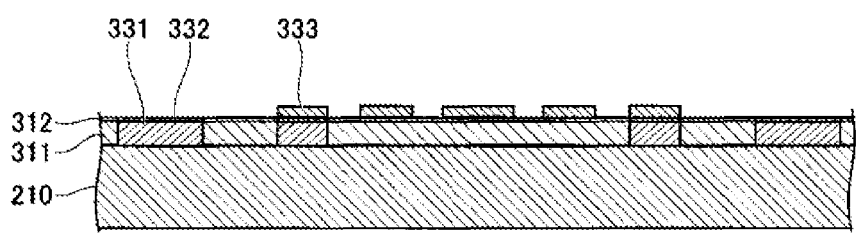
FIG. 16 is a cross-sectional view of the spatial light modulation element 200 in a manufacturing process.

Subsequently, the third metal layer 333 is patterned as shown in FIG. 16. Due to this, the fixed frame 234, the movable frame 236, and the swing section 238 of the gimbal section 230 are formed. It is possible to appropriately select various types of dry etching or wet etching as the patterning method of the third metal layer 333.

Figure 17:
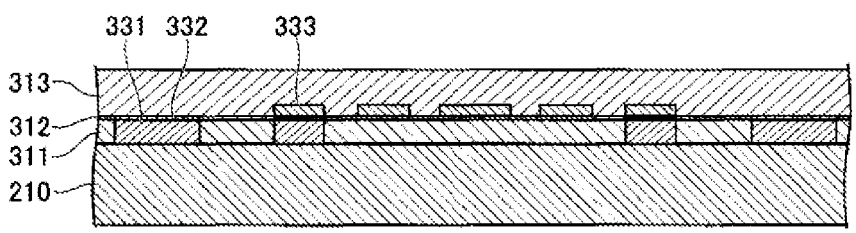
FIG. 17 is a cross-sectional view of the spatial light modulation element 200 in a manufacturing process.

Subsequently, as shown in FIG. 17, the entire surface of the third metal layer 333 and the second sacrificial layer 312 is flattened by a third sacrificial layer 313. It is also possible for the third sacrificial layer 313 to be formed by coating and pre-baking a resist material using spin coating, spray coating, or the like.

The thickness of the third sacrificial layer 313 above the third metal layer 333 corresponds to the height of the supporting posts 248 in the reflecting section 240 of the spatial light modulation element 200. For this reason, the third sacrificial layer 313 is deposited to be thicker than the thickness of the third metal layer 333 and the third metal layer 333 is filled into the inner section of the third sacrificial layer 313.

Figure 18:
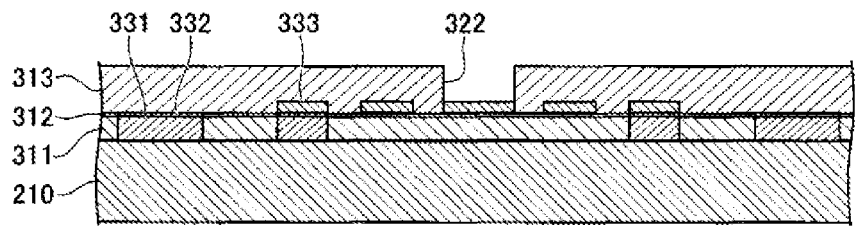
FIG. 18 is a cross-sectional view of the spatial light modulation element 200 in a manufacturing process.

Next, as shown in FIG. 18, a contact hole 322 which reaches the top of the third metal layer 333 is formed by patterning the third sacrificial layer 313. The contact hole 322 is provided in a region where the supporting posts 248 of the reflecting section 240 are formed in the spatial light modulation element 200. It is possible for the third sacrificial layer 313 to be patterned using a dry etching method such as plasma etching.

Figure 19:
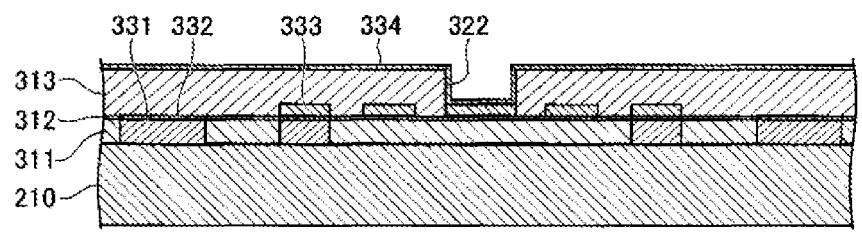
FIG. 19 is a cross-sectional view of the spatial light modulation element 200 in a manufacturing process.

Subsequently, as shown in FIG. 19, a fourth metal layer 334 which is the movable electrode 246 of the reflecting section 240 is formed by depositing a metal on the entirety of the surface of the third sacrificial layer 313 and the inner surface and the bottom surface of the contact hole 322. It is possible to form the fourth metal layer 334, for example, by depositing a metal material such as a TiAl alloy using a physical vapor deposition method, a chemical vapor deposition method, a plating method, or the like.

Figure 20:
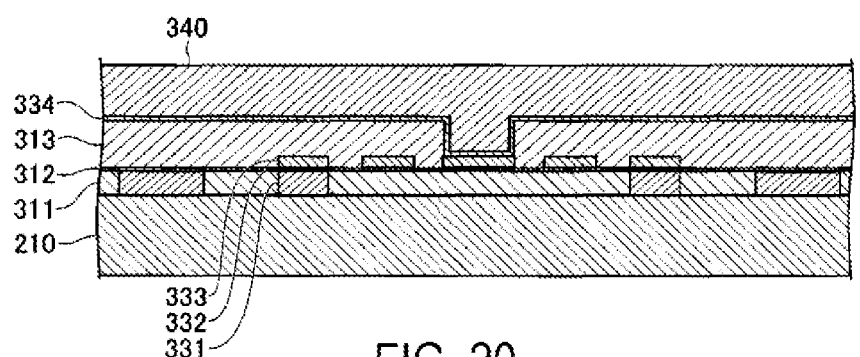
FIG. 20 is a cross-sectional view of the spatial light modulation element 200 in a manufacturing process.

Next, as shown in FIG. 20, an amorphous silicon layer 340 which is the support layer 242 of the reflecting section 240 is deposited over the entire fourth metal layer 334. The method for forming the amorphous silicon layer 340 can be selected from among any type of physical vapor deposition or chemical vapor deposition. Here, since the contact hole 322 formed in the third sacrificial layer 313 is deep, there are cases where depressions following the shape of the contact hole 322 are formed in the surface of the amorphous silicon layer 340.

Figure 21:
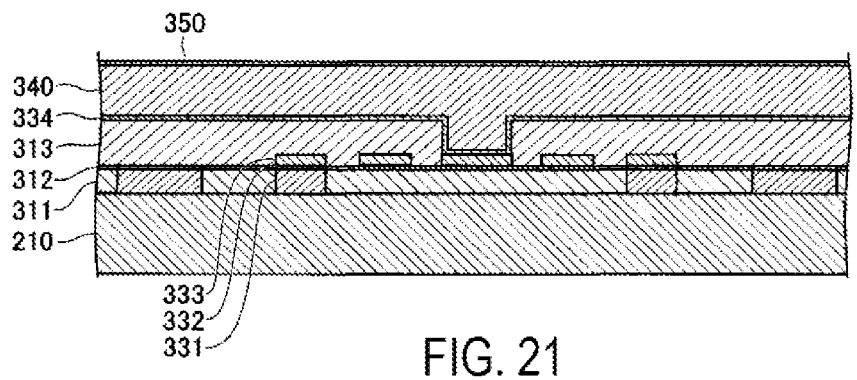
FIG. 21 is a cross-sectional view of the spatial light modulation element 200 in a manufacturing process.

Furthermore, as shown in FIG. 21, a reflective film 350 which is the reflecting layer 244 is formed on the entire surface of the amorphous silicon layer 340. The reflective film 350 may be formed of a metal material. In addition, the reflective film 350 may be formed of a dielectric multilayer film. The method for forming the reflective film 350 can be selected from among any type of physical vapor deposition or chemical vapor deposition.

Here, before forming the reflective film 350, the surface of the amorphous silicon layer 340 may be mirror-polished. Due to this, it is possible to improve the flatness of the reflective film 350 surface and to improve the reflectivity in the reflective film 350.

Figure 22:
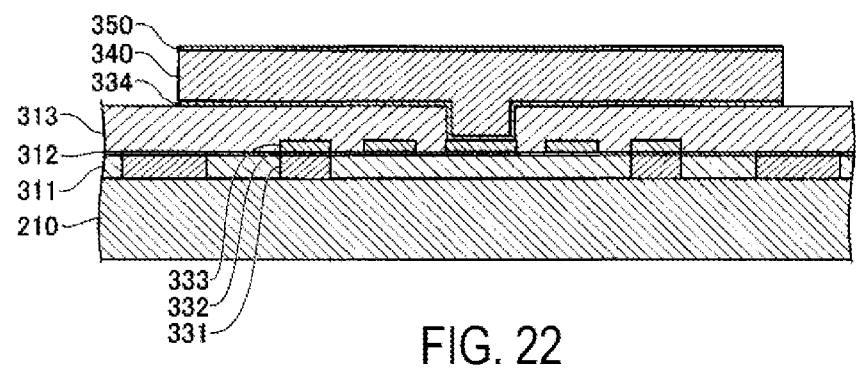
FIG. 22 is a cross-sectional view of the spatial light modulation element 200 in a manufacturing process.

Subsequently, as shown in FIG. 22, the fourth metal layer 334, the amorphous silicon layer 340, and the reflective film 350 are trimmed as a batch. A dry etching method such as plasma etching can be preferably used for the trimming. Due to this, the surface of the third sacrificial layer 313 is exposed in the vicinity of the edge section of the fourth metal layer 334.

Figure 23:
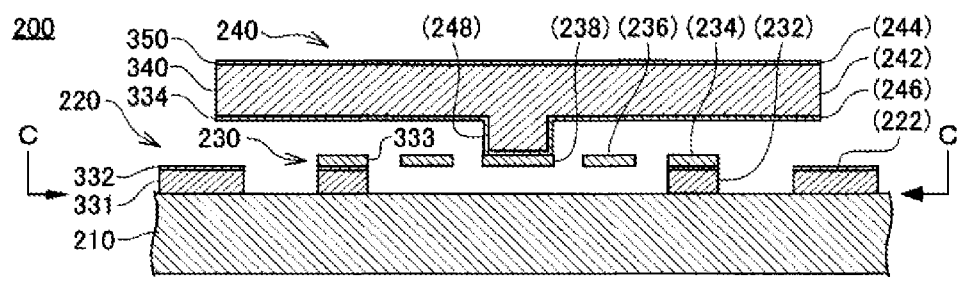
FIG. 23 is a cross-sectional view of a spatial light modulation element 201.

Next, as shown in FIG. 23, the spatial light modulation element 200 is completed by removing the sacrificial layers from the third sacrificial layer 313 to the first sacrificial layer 311. Since the sacrificial layers from the third sacrificial layer 313 to the first sacrificial layer 311 are all directly or indirectly continuous, it is possible to remove the sacrificial layers in a batch by etching using a gas or a liquid.

In the spatial light modulation element 200 produced through the processes described above, the movable electrode 246 is electrically connected to the surface of the substrate 210 through the gimbal section 230 made of metal. Thus, the movable electrode 246 is connected with a reference voltage, for example, a ground potential, through a circuit on the substrate 210. Due to this, it is possible to form a stabilized electric field between the fixed electrodes 212 and 214 which oppose the movable electrode 246 and to which the driving power is applied.

In addition, in the spatial light modulation element 200, the shielding section 220, which itself is made of metal, is formed on the substrate 210. Thus, the shielding section 220 is connected with a reference voltage, for example, a ground potential, through the circuit on the substrate 210. Due to this, it is possible for the shielding section 220 to effectively prevent the entry of electromagnetic waves from outside and the irradiation of electromagnetic waves from the spatial light modulation element 200 itself to the outside is also interrupted. Thus, in the spatial light modulator 100 where many spatial light modulation elements 200 are disposed to be adjacent, the operation of the individual spatial light modulation elements 200 is stabilized.

Furthermore, in the spatial light modulation element 200, since the movable electrode 246 is disposed on the lower surface of the reflecting section 240 which is separated from the substrate 210, the margin until the pull-in phenomenon occurs is large. Thus, it is not necessary to expand the interval between the fixed electrodes 212 and 214 and the movable electrode 246 by thickening the sacrificial layers.

Due to this, it is possible to avoid cracks and the like generated in a case where the sacrificial layers are thickened, and it is possible to reduce the process risk. In addition, since the height of the reflecting section 240 which swings need not be unnecessarily increased, it is possible to suppress an increase in the displacement amount of the reflecting section 240 in the surface direction of the substrate 210. Thus, in a case where a plurality of the spatial light modulation elements 200 is lined up in the spatial light modulator 100, it is possible to improve the aperture ratio of the spatial light modulator 100 by making the intervals closer between the spatial light modulation elements 200 which are adjacent to each other.

Here, in the series of manufacturing processes described above, a stage of mirror-polishing the surface of the reflective film 350 may be introduced before the stage of removing the first sacrificial layer 311, the second sacrificial layer 312, and the third sacrificial layer 313 shown in FIG. 23. Due to this, it is possible to further improve the reflectivity in the reflective film 350.

In addition, description was given of the manufacturing processes of a single spatial light modulation element 200; however, numerous spatial light modulation elements 200 may be produced at the same time on one substrate 210. Furthermore, in addition to producing more spatial light modulation elements 200 on one substrate 210, it is possible to manufacture, on the same axis, a plurality of spatial light modulators 100 each having a plurality of spatial light modulation elements 200 by dicing each substrate 210. Due to this, the productivity is improved and it is possible to supply the spatial light modulators 100 at low cost.

FIG. 24 to FIG. 30 show manufacturing processes of another spatial light modulation element 201. In these diagrams, the same reference numerals are given to elements in common with the manufacturing processes of the spatial light modulation element 200 and redundant description thereof will be omitted.

In addition, the stages described with reference to FIG. 8 to FIG. 18 for the spatial light modulation element 200 are common to the manufacturing processes of the spatial light modulation element 201. Thus, FIG. 24 shows a stage continuing from the stage shown in FIG. 18.

Figure 24:
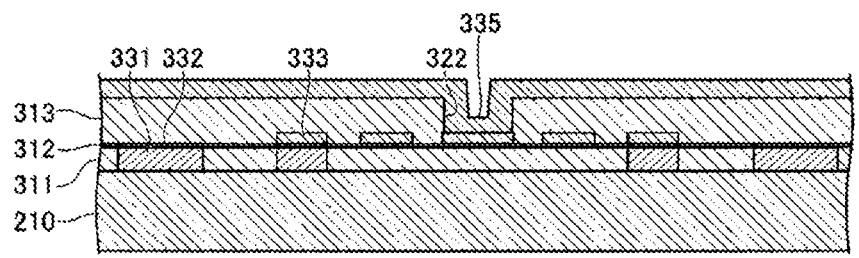
FIG. 24 is a cross-sectional view of the spatial light modulation element 201 in a manufacturing process.

In the manufacturing processes of the spatial light modulation element 201, as shown in FIG. 24, metal is deposited over the entirety of the surface of the third sacrificial layer 313 provided with the contact hole 322 and the surface of the third metal layer 333 which appears in the inner section of the contact hole 322. Due to this, a fifth metal layer 335 which is a part of the supporting posts 248 of the reflecting section 240 is formed.

The fifth metal layer 335 is formed even on the side walls of the contact hole 322 without being interrupted. In other words, the fifth metal layer 335 is deposited to a thickness which is not interrupted even at the upright portion in the side walls of the contact hole 322.

It is possible to form the fifth metal layer 335, for example, by depositing a metal material such as a TiAl alloy using a physical vapor deposition method, a chemical vapor deposition method, a plating method, or the like. Here, the fifth metal layer 335 is referred to as the "fifth" for the purpose of making a distinction with the other previous metal layers and does not have the meaning that the fifth metal layer 335 is formed after the fourth metal layer 334 to be described below.

Figure 25:
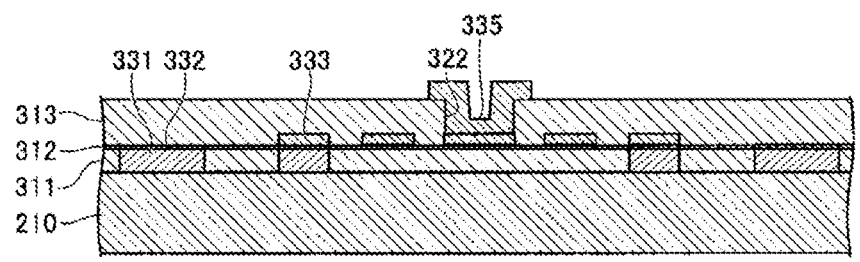
FIG. 25 is a cross-sectional view of the spatial light modulation element 201 in a manufacturing process.

In addition, as shown in FIG. 25, the fifth metal layer 335 is patterned and a portion other than the inner section and the periphery of the contact hole 322 is removed. It is possible to appropriately select various types of dry etching or wet etching as the patterning method of the fifth metal layer 335.

Figure 26:
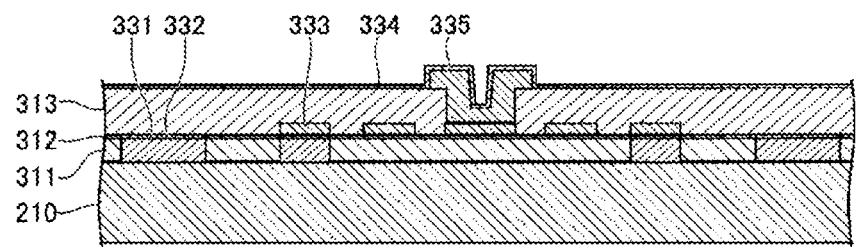
FIG. 26 is a cross-sectional view of the spatial light modulation element 201 in a manufacturing process.

Subsequently, as shown in FIG. 26, the fourth metal layer 334 which is the movable electrode 246 of the reflecting section 240 is formed by depositing a metal on the entire surface of the third sacrificial layer 313 and the fifth metal layer 335. It is possible to form the fourth metal layer 334, for example, by depositing a metal material such as a TiAl alloy using a physical vapor deposition method, a chemical vapor deposition method, a plating method, or the like. The film thickness of the fourth metal layer 334 is thinner than the film thickness of the fifth metal layer 335.

Figure 27:
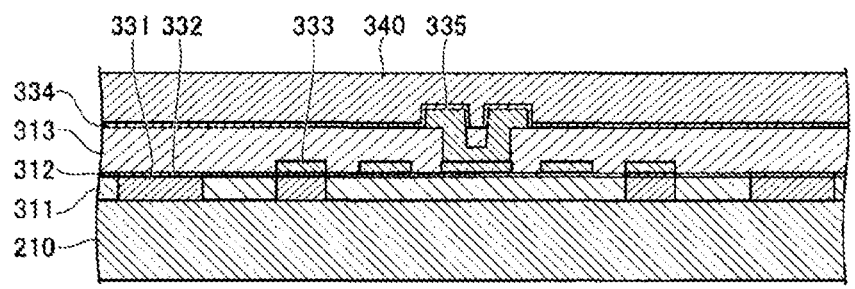
FIG. 27 is a cross-sectional view of the spatial light modulation element 201 in a manufacturing process.

Next, as shown in FIG. 27, the amorphous silicon layer 340 which is the support layer 242 of the reflecting section 240 is deposited over the entire fourth metal layer 334. The method for forming the amorphous silicon layer 340 can be selected from among any type of physical vapor deposition or chemical vapor deposition.

Here, out of the third sacrificial layer 313 and the fifth metal layer 335 which are the deposition base of the amorphous silicon layer 340, the fifth metal layer 335 protrudes. For this reason, there are cases where the surface of the amorphous silicon layer 340 is slightly raised above the fifth metal layer 335 in the diagram.

Figure 28:
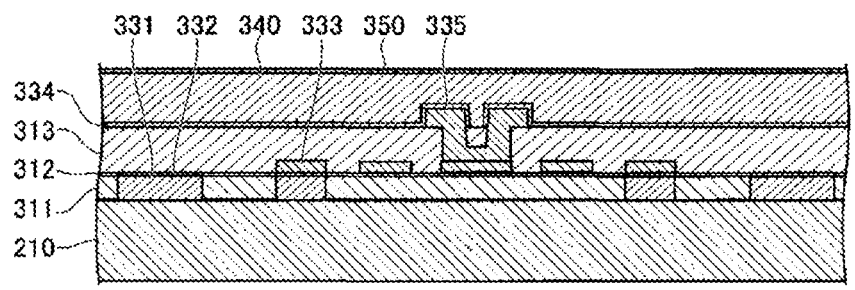
FIG. 28 is a cross-sectional view of the spatial light modulation element 201 in a manufacturing process.

Next, as shown in FIG. 28, the reflective film 350 which is the reflecting layer 244 is formed on the entire surface of the amorphous silicon layer 340. In a case where a part of the amorphous silicon layer 340 is raised, the ridges of the amorphous silicon layer 340 are also repeated in the surface of the reflective film 350.

The reflective film 350 may be formed of a metal material. In addition, the reflective film 350 may be formed of a dielectric multilayer film. The method for forming the reflective film 350 can be selected from among any type of physical vapor deposition or chemical vapor deposition.

Here, the surface of the amorphous silicon layer 340 may be mirror-polished before forming the reflective film 350. Due to this, it is possible to improve the flatness of the reflective film 350 surface and to improve the reflectivity in the reflective film 350.

Figure 29:
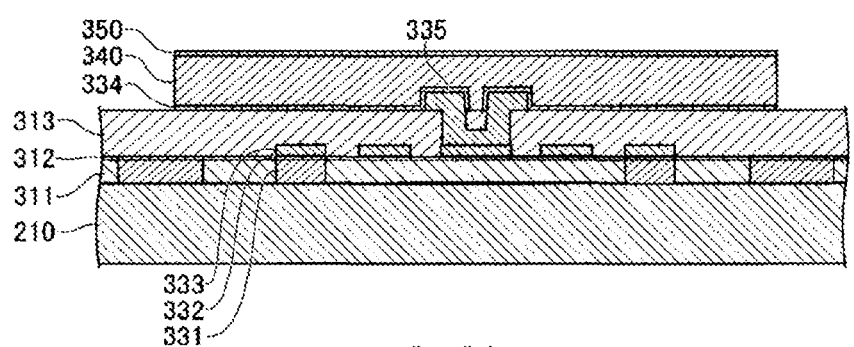
FIG. 29 is a cross-sectional view of the spatial light modulation element 201 in a manufacturing process.

Subsequently, as shown in FIG. 29, the fourth metal layer 334, the amorphous silicon layer 340, and the reflective film 350 are trimmed as a batch. A dry etching method such as plasma etching can be preferably used for the trimming. Due to this, the surface of the third sacrificial layer 313 is exposed in the vicinity of the edge sections of the fourth metal layer 334.

Figure 30:
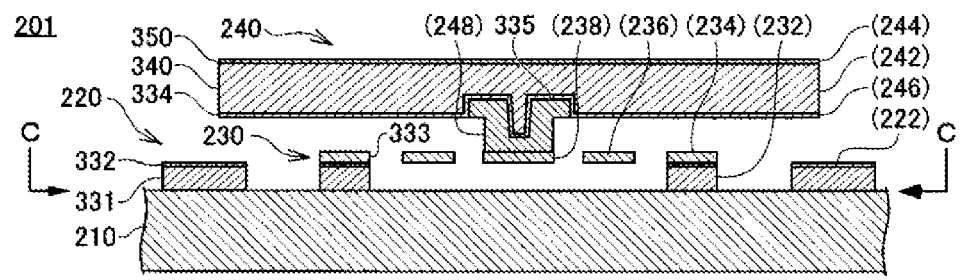
FIG. 30 is a cross-sectional view of the spatial light modulation element 201.

Next, as shown in FIG. 30, the spatial light modulation element 201 is completed by removing the sacrificial layers from the third sacrificial layer 313 to the first sacrificial layer 311. Since the sacrificial layers from the third sacrificial layer 313 to the first sacrificial layer 311 are all directly or indirectly continuous, it is possible to remove the sacrificial layers in a batch by etching using a gas or a liquid.

In the spatial light modulation element 201 produced through the processes described above, the movable electrode 246 is connected with the gimbal section 230 via the fifth metal layer 335 which forms a part of the supporting posts 248. As already described, the fifth metal layer 335 has a film thickness which is greater than the film thickness of the fourth metal layer 334 which forms the movable electrode 246 and is formed without being interrupted even on the side walls of the supporting posts 248.

Thus, in the spatial light modulation element 201, the movable electrode 246 and the gimbal section 230 are reliably electrically connected. In addition, the electrical resistance in the supporting posts 248 is lowered and the potentials of the movable electrode 246 and the gimbal section 230 are equal. Due to this, the electrical characteristics of the spatial light modulation element 201 are stabilized and the controllability is improved.

In addition, since the contact hole 322 of a case where the supporting posts 248 are formed is filled in by the fifth metal layer 335, the surface of the amorphous silicon layer 340 which is the deposition base of the reflective film 350 is substantially flat. Thus, the flatness of the reflective film 350 is improved and the effective aperture ratio of the spatial light modulation element 201 is increased.

Figure 31:
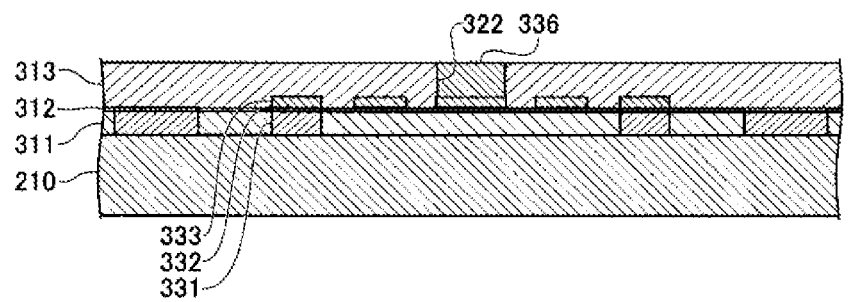
FIG. 31 is a cross-sectional view of a spatial light modulation element 202 in a manufacturing process.

FIG. 31 to FIG. 36 show manufacturing processes of another spatial light modulation element 202. In these diagrams, the same reference numerals are given to elements in common with the spatial light modulation elements 200 and 201 and redundant description thereof will be omitted. In addition, the stages described with reference to FIG. 8 to FIG. 18 for the spatial light modulation element 200 are in common with the manufacturing processes of the spatial light modulation element 202. Thus, FIG. 31 shows a stage continuing from the stage shown in FIG. 18.

In the manufacturing processes of the spatial light modulation element 202, as shown in FIG. 31, a metal material is deposited in the contact hole 322 formed in the third sacrificial layer 313. Due to this, a sixth metal layer 336 which is the supporting posts 248 of the reflecting section 240 in the spatial light modulation element 202 is formed to have the same film thickness as the film thickness of the third sacrificial layer 313.

It is possible to form the sixth metal layer 336, for example, by depositing a metal material such as a TiAl alloy using a physical vapor deposition method, a chemical vapor deposition method, a plating method, or the like. Here, the sixth metal layer 336 is referred to as the "sixth" for the purpose of making a distinction with the previous fourth metal layer 334 and the fifth metal layer 335 and does not have the meaning that the sixth metal layer 336 is formed after the fourth metal layer 334.

Figure 32:
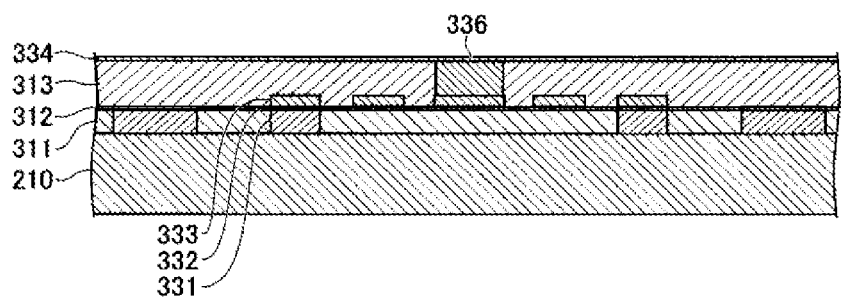
FIG. 32 is a cross-sectional view of the spatial light modulation element 202 in a manufacturing process.

Subsequently, as shown in FIG. 32, the fourth metal layer 334 which is the movable electrode 246 is formed by depositing a metal on the entire surface of the third sacrificial layer 313 and the fifth metal layer 335. It is possible to form the fourth metal layer 334 by depositing a metal material such as a TiAl alloy using a physical vapor deposition method, a chemical vapor deposition method, a plating method, or the like.

Figure 33:
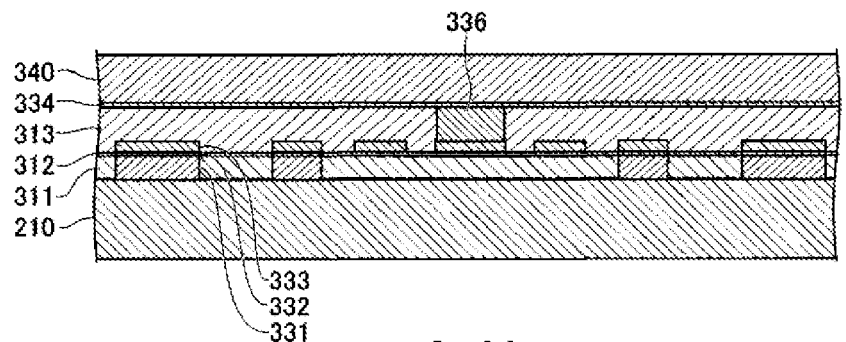
FIG. 33 is a cross-sectional view of the spatial light modulation element 202 in a manufacturing process.

Next, as shown in FIG. 33, the amorphous silicon layer 340 which is the support layer 242 is deposited over the entire fourth metal layer 334. The method for forming the amorphous silicon layer 340 can be selected from among any type of physical vapor deposition or chemical vapor deposition.

Here, the surfaces of the third sacrificial layer 313 and the sixth metal layer 336 which are the deposition base of the amorphous silicon layer 340 are substantially flat. However, there are cases where the surface of the amorphous silicon layer 340 is slightly raised above the sixth metal layer 336 in the diagram due to differences in the base material.

Figure 34:
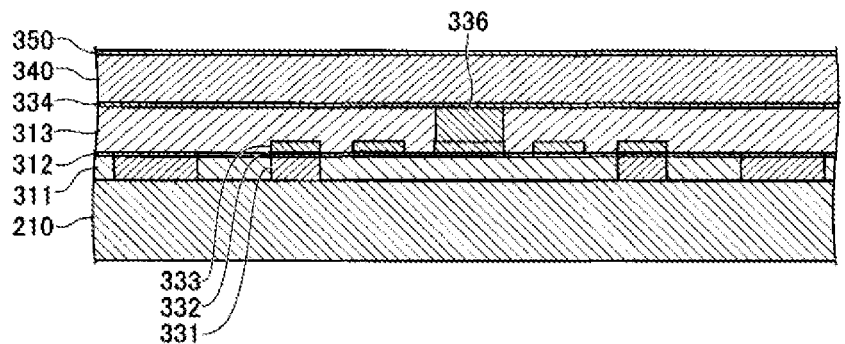
FIG. 34 is a cross-sectional view of the spatial light modulation element 202 in a manufacturing process.

Next, as shown in FIG. 34, the reflective film 350 which is the reflecting layer 244 is formed on the entire surface of the amorphous silicon layer 340. In a case where a part of the amorphous silicon layer 340 is raised, the ridges of the amorphous silicon layer 340 are also repeated in the surface of the reflective film 350.

The reflective film 350 may be formed of a metal material. In addition, the reflective film 350 may be formed of a dielectric multilayer film. The method for forming the reflective film 350 can be selected from among any type of physical vapor deposition or chemical vapor deposition. In addition, the surface of the amorphous silicon layer 340 may be mirror-polished before forming the reflective film 350. Due to this, the flatness of the reflective film 350 surface is improved and it is possible to improve the reflectivity in the reflective film 350.

Figure 35:
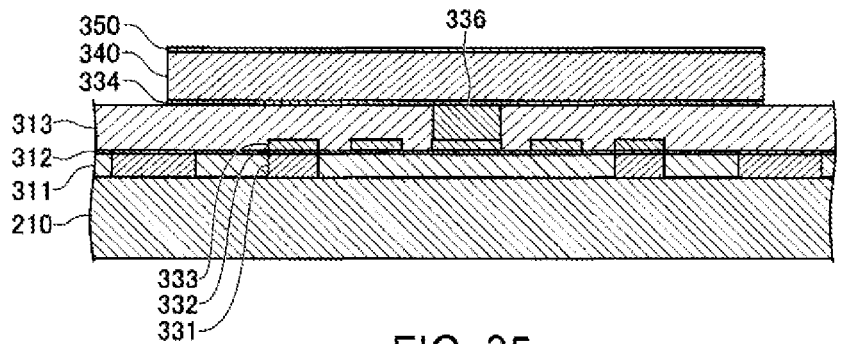
FIG. 35 is a cross-sectional view of the spatial light modulation element 202 in a manufacturing process.

Subsequently, as shown in FIG. 35, the fourth metal layer 334, the amorphous silicon layer 340, and the reflective film 350 are trimmed as a batch. A dry etching method such as plasma etching can be preferably used for the trimming. Due to this, the surface of the third sacrificial layer 313 is exposed in the vicinity of the edge sections of the fourth metal layer 334.

Figure 36:
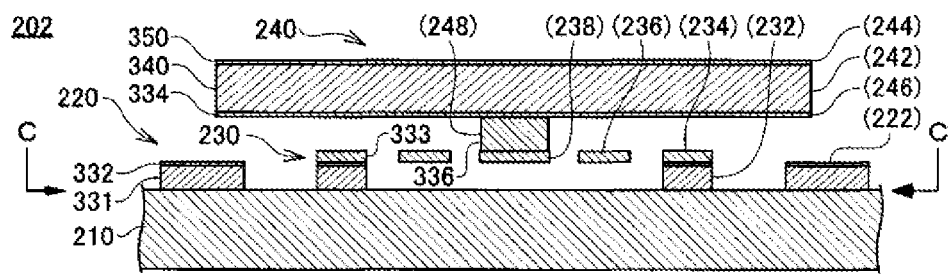
FIG. 36 is a cross-sectional view of the spatial light modulation element 202.

Next, as shown in FIG. 36, the spatial light modulation element 202 is completed by removing the sacrificial layers from the third sacrificial layer 313 to the first sacrificial layer 311. Since the sacrificial layers from the third sacrificial layer 313 to the first sacrificial layer 311 are all directly or indirectly continuous, it is possible to remove the sacrificial layers in a batch by etching using a gas or a liquid.

In the spatial light modulation element 202 produced through the processes described above, the movable electrode 246 is connected with the gimbal section 230 via the sixth metal layer 336 which forms the supporting posts 248. Here, since the supporting posts 248 are formed entirely of metal, the movable electrode 246 and the gimbal section 230 are reliably electrically connected.

In addition, the electrical resistance in the supporting posts 248 is lowered and a difference in the potentials of the movable electrode 246 and the gimbal section 230 is not easily generated. Due to this, the electrical characteristics of the spatial light modulation element 202 are stabilized and the controllability is improved.

In addition, since the deposition base of the amorphous silicon layer 340 is flat, the surface of the reflective film 350 is flat. Thus, the flatness of the reflective film 350 is improved and the effective aperture ratio of the spatial light modulation element 202 is increased.

FIG. 37 to FIG. 41 show manufacturing processes of another spatial light modulation element 203. In these diagrams, the same reference numerals are given to elements in common with the manufacturing processes of the spatial light modulation element 200 and redundant description thereof will be omitted.

In addition, the stages described with reference to FIG. 8 to FIG. 19 for the spatial light modulation element 200 are in common with the manufacturing processes of the spatial light modulation element 203. Thus, FIG. 37 shows a stage continuing from the stage shown in FIG. 19.

Figure 37:
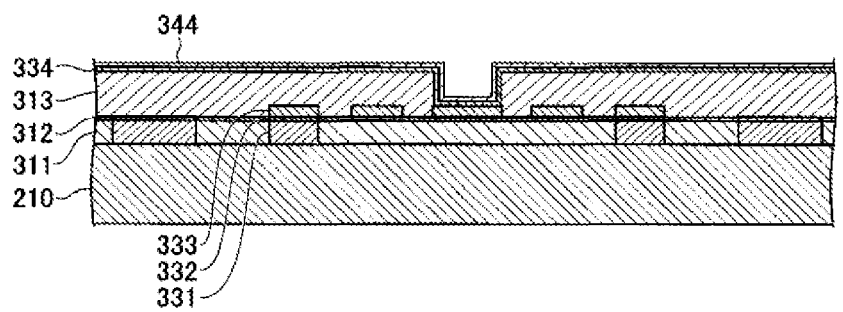
FIG. 37 is a cross-sectional view of a spatial light modulation element 203 in a manufacturing process.

In the manufacturing processes of the spatial light modulation element 203, as shown in FIG. 37, a high-concentration p-type layer 344 is formed by being laminated on the fourth metal layer 334 which is the movable electrode 246.

The high-concentration p-type layer 344 is formed by doping dopant impurities at a high concentration using ion implantation after depositing amorphous silicon with the same method as the forming of the support layer 242.

Figure 38:
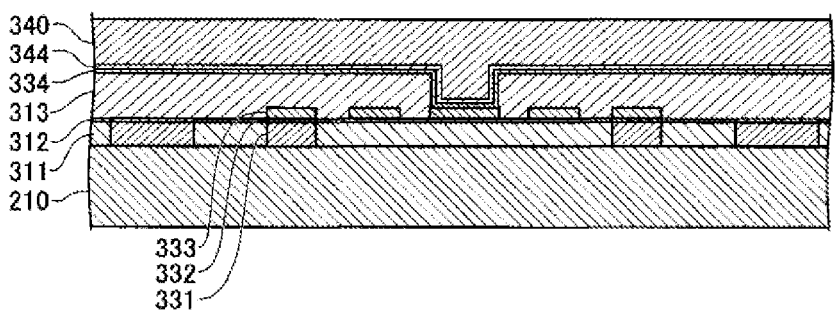
FIG. 38 is a cross-sectional view of the spatial light modulation element 203 in a manufacturing process.

Next, as shown in FIG. 38, the amorphous silicon layer 340 which is the support layer 242 is deposited over the entire surface of the high-concentration p-type layer 344. The method for forming the amorphous silicon layer 340 can be selected from among any type of physical vapor deposition or chemical vapor deposition.

Figure 39:
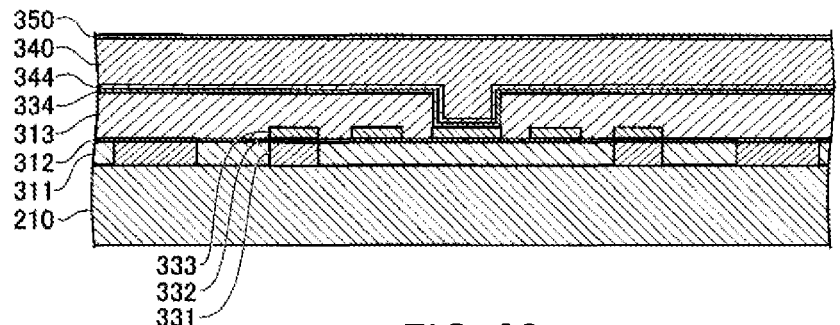
FIG. 39 is a cross-sectional view of the spatial light modulation element 203 in a manufacturing process.

Next, as shown in FIG. 39, the reflective film 350 which is the reflecting layer 244 is formed on the entire surface of the amorphous silicon layer 340. It is possible to form the reflective film 350 of a metal material or a dielectric multilayer film. The method for forming the reflective film 350 can be selected from among any type of physical vapor deposition or chemical vapor deposition. In addition, the surface of the amorphous silicon layer 340 may be mirror-polished before forming the reflective film 350. Due to this, it is possible to improve the reflectivity in the reflective film 350.

Figure 40:
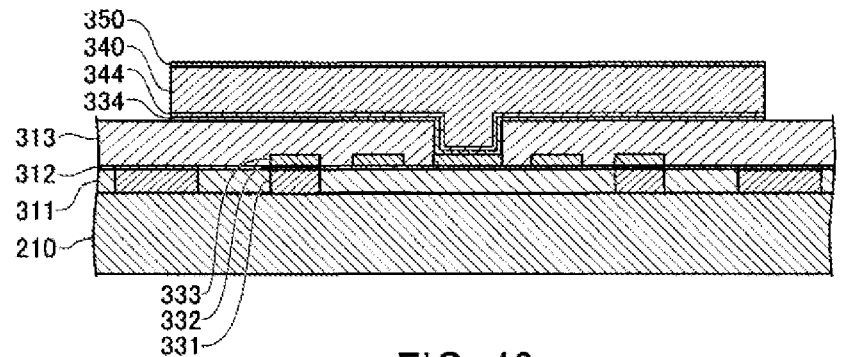
FIG. 40 is a cross-sectional view of the spatial light modulation element 203 in a manufacturing process.

Subsequently, as shown in FIG. 40, the fourth metal layer 334, the amorphous silicon layer 340, and the reflective film 350 are trimmed as a batch. It is possible to use a dry etching method such as plasma etching for the trimming. Due to this, the surface of the third sacrificial layer 313 is exposed in the vicinity of the edge sections of the fourth metal layer 334.

Figure 41:
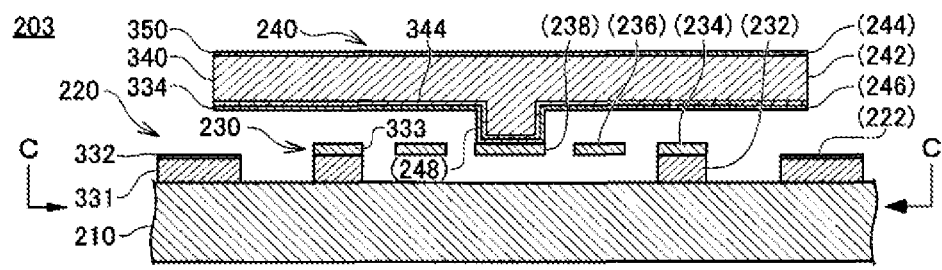
FIG. 41 is a cross-sectional view of the spatial light modulation element 203.

Next, as shown in FIG. 41, the spatial light modulation element 203 is completed by removing the sacrificial layers from the third sacrificial layer 313 to the first sacrificial layer 311. Since the sacrificial layers from the third sacrificial layer 313 to the first sacrificial layer 311 are all directly or indirectly continuous, it is possible to remove the sacrificial layers in a batch by etching using a gas or a liquid.

In the spatial light modulation element 203 produced through the processes described above, the high-concentration p-type layer 344 is interposed at an interface between the amorphous silicon layer 340 and the movable electrode 246. Due to this, an ohmic contact is formed between the amorphous silicon layer 340 and the movable electrode 246.

In a case where the amorphous silicon layer 340 which is a semiconductor and the movable electrode 246 which is metal are in direct contact, a Schottky junction is formed between the amorphous silicon layer 340 and the movable electrode 246 and a rectification effect occurs. However, in a case where an ohmic contact is formed at the interface between the amorphous silicon layer 340 and the movable electrode 246, the potential of the movable electrode 246 is stabilized since the rectification effect does not occur and the response with respect to the applied driving power is stabilized.

Figure 42:
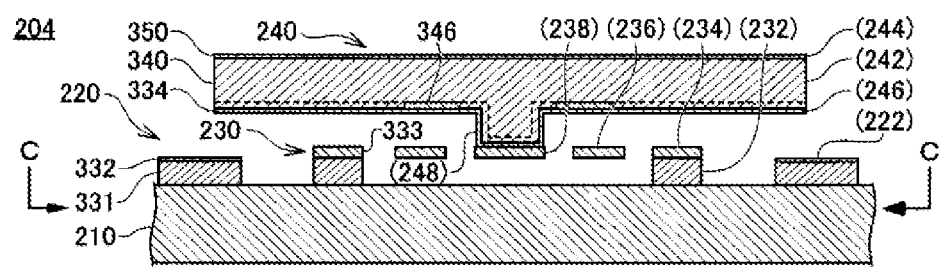
FIG. 42 is a cross-sectional view of a spatial light modulation element 204.

Here, the spatial light modulation element 203 has a structure in which the high-concentration p-type layer 344 is formed over the entire interface between the amorphous silicon layer 340 and the movable electrode 246. However, if the high-concentration p-type layer 346 is formed on a part of the interface as in the spatial light modulation element 204 shown in FIG. 42, the ohmic contact is formed between the amorphous silicon layer 340 and the movable electrode 246 and the rectification effect due to the Schottky junction is nullified. Thus, the same effect is generated even when the high-concentration p-type layer 346 is formed in a part of the interface between the amorphous silicon layer 340 and the movable electrode 246 due to partial ion implantation.

In addition, the spatial light modulation elements 204 and 205 have the same structure as the spatial light modulation element 200 shown in FIG. 23 and the like apart from having the high-concentration p-type layers 344 and 346. However, even in the spatial light modulation element 201 shown in FIG. 30, the spatial light modulation element 202 shown in FIG. 36, and the like, it is possible to make the reflecting section 240 electrically stable by nullifying the rectification effect of the interface by forming an ohmic contact by providing the high-concentration p-type layers 344 and 346 at the interface between the amorphous silicon layer 340 which is a semiconductor and the movable electrode 246 which is metal. Furthermore, even in a case of a structure different from that of the spatial light modulation elements 200, 201, and 202 using the gimbal section 230, for example, in which the reflecting section 240 is supported by flexures or the like, it is possible to apply a structure in which the rectification effect is cancelled due to the high-concentration p-type layers 344 and 346.

Figure 43:
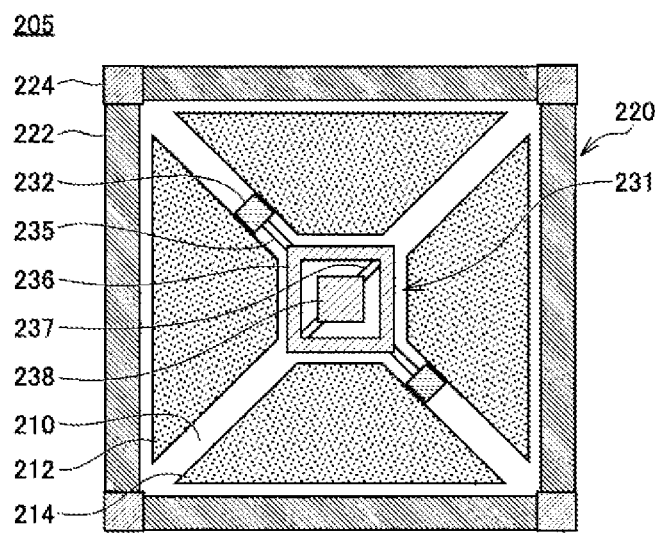
FIG. 43 is a cross-sectional view of a spatial light modulation element 205.

FIG. 43 is a schematic plan view of another spatial light modulation element 205. The spatial light modulation element 205 has the same structure as the spatial light modulation element 200 shown in FIG. 3, and the like apart from the portion to be described next. Thus, the same reference numerals are given to common elements and redundant description thereof will be omitted.

In the spatial light modulation element 205, a gimbal section 231 has a different structure to the gimbal section 230 of the spatial light modulation element 200. That is, the gimbal section 231 has the movable frame 236 supported directly from a pair of supporting posts 232 via torsion shaft sections 235 and the swing section 238 supported from the movable frame 236 via torsion shaft sections 237.

Due to this, the gimbal section 231 of the spatial light modulation element 205 takes up a smaller area on the surface of the substrate 210 than the gimbal section 230 of the spatial light modulation element 200 provided with the secured frame 234. Thus, it is possible to widen the area of the fixed electrodes 212 and 214 disposed so as not to overlap the gimbal section 231 and it is possible to exert a large driving force with respect to the movable electrode 246 of the reflecting section 240.

Here, in the spatial light modulation element 205, for example, electrostatic force from the two adjacent fixed electrodes 212 and 214 is exerted in a case where the reflecting section 240 swings with the torsion shaft section 235 as a swing axis. Due to this, the driving power exerted on the movable electrode 246 is further increased in comparison with a case where electrostatic force according to one fixed electrode is exerted.

Figure 44:
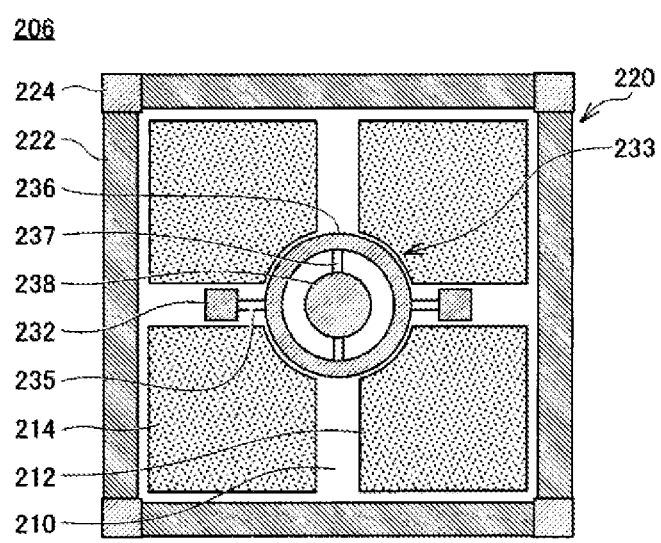
FIG. 44 is a cross-sectional view of a spatial light modulation element 206.

FIG. 44 is a schematic plan view of another spatial light modulation element 206. The spatial light modulation element 206 has the same structure as the spatial light modulation element 205 shown in FIG. 43 and the like, apart from the portion to be described next. Thus, the same reference numerals are given to common elements and redundant description thereof will be omitted.

The point that the movable frame 236 is supported from the supporting posts 232 via the torsion shaft section 237A is common to the gimbal section 233 of the spatial light modulation element 206 and the gimbal section 231 of the spatial light modulation element 205. However, in the gimbal section 233 of the spatial light modulation element 206, a pair of supporting posts 232 are disposed in parallel with the longitudinal direction of the shielding plate 222 and each of the torsion shaft sections 235 and 237 is disposed in a direction parallel with the longitudinal direction of the shielding plate 222.

According to this arrangement of the supporting posts, the intervals between each of the fixed electrodes 212 and 214 disposed on the surface of the substrate 210 are disposed to be orthogonal to each side in the center of each side of a rectangular region surrounded by the shielding section 220 and not on a diagonal line in the substrate 210. Due to this, the length of the interval between the fixed electrodes 212 and 214 is shortened and the effective area of the fixed electrodes is increased.

In addition, the fixed electrodes 212 and 214 are disposed at each corner section of the substrate 210, furthest from the swing center of the swing section 238 on the substrate 210. Thus, the electrostatic force generated between the fixed electrodes 212 and 214 and the movable electrode 246 efficiently drives the reflecting section 240.

Figure 45:
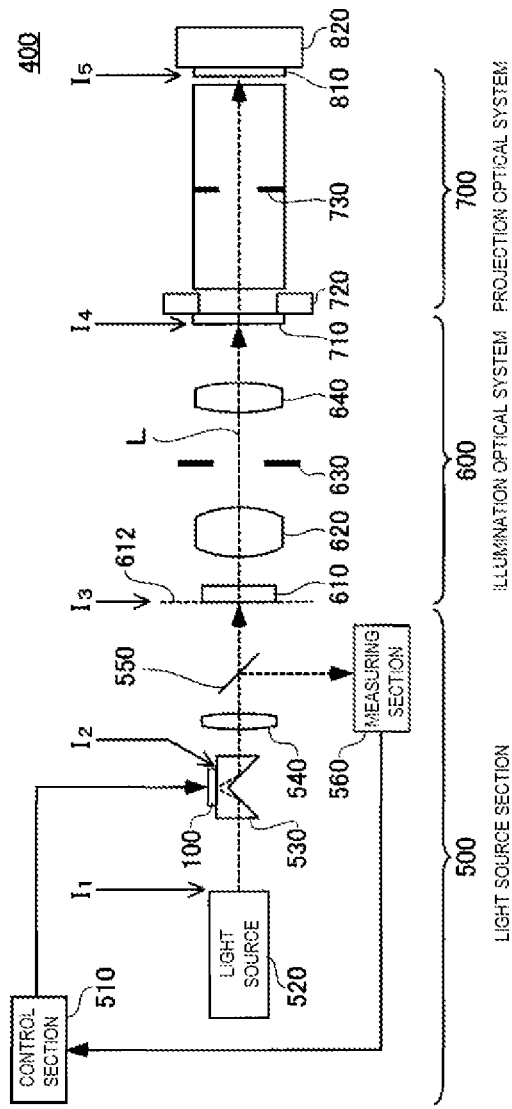
FIG. 45 is a schematic view of an exposure apparatus 400.

FIG. 45 is a schematic view of the exposure apparatus 400. The exposure apparatus 400 is provided with an illumination light generating section 500, an illumination optical system 600, and a projection optical system 700. The exposure apparatus 400 is provided with the spatial light modulator 100 and it is possible for illumination light having any illumination distribution to be incident on the illumination optical system 600 in a case where a light source mask optimization method is executed.

The illumination light generating section 500 includes a control section 510, a light source 520, the spatial light modulator 100, a prism 530, an imaging optical system 540, a beam splitter 550, and a measuring section 560. The light source 520 generates the illumination light L. The illumination light L generated by the light source 520 has an illumination distribution corresponding to characteristics of the light emitting mechanism of the light source 520. Therefore, the illumination light L has a raw image $I_1$ in a cross-section orthogonal to the optical path of the illumination light L.

The illumination light L emitted from the light source 520 is incident to the prism 530. The prism 530 guides the illumination light L to the spatial light modulator 100, and then emits the light to the outside again. The spatial light modulator 100 modulates the illumination light L incident thereto under the control of the control section 510. The structure and operation of the spatial light modulator 100 has already been described above.

The illumination light L emitted from the prism 530 through the spatial light modulator 100 passes through the imaging optical system 540 and is then incident to the illumination optical system 600. The imaging optical system 540 forms an illumination light image $I_3$ on an incident surface 612 of the illumination optical system 600.

The beam splitter 550 is disposed in the optical path of the illumination light L, between the imaging optical system 540 and the illumination optical system. The beam splitter 550 splits a portion of the illumination light L prior to being incident to the illumination optical system 600, and guides this split portion to the measuring section 560.

The measuring section 560 measures the image of the illumination light L at a position optically conjugate with the incident surface 612 of the illumination optical system 600. Due to this, the measuring section 560 measures the image which is the same as the illumination light image $I_3$ incident to the illumination optical system 600. Thus, it is possible for the control section 510 to perform feedback control of the spatial light modulator 100, by referencing the illumination light image $I_3$ measured by the measuring section 560.

The illumination optical system 600 includes a fly eye lens 610, a condenser optical system 620, a field stop 630, and an imaging optical system 640. The emission end of the illumination optical system 600 has a mask stage 720 holding a mask 710 disposed thereon.

The fly eye lens 610 is provided with a large number of lens elements disposed in parallel with high density, and forms a secondary light source including the same number of illumination light images $I_3$ as the number of lens elements on the rear focal surface. The condenser optical system 620 focuses the illumination light L emitted from the fly eye lens 610 and illuminates the field stop 630 in a superimposed manner.

The illumination light L that has passed through the field stop 630 forms an emission light image $I_4$, which is an image of the aperture of the field stop 630, on a pattern surface of the mask 710 due to the imaging optical system 640. In this manner, it is possible for the illumination optical system 600 to execute Kohler illumination using the emission light image $I_4$ on the pattern surface of the mask 710 disposed on the emission end thereof.

The illumination distribution formed at the incident end of the fly eye lens 610, which is also the incident surface 612 of the illumination optical system 600, exhibits a high correlation with a global illumination distribution of the overall secondary light source formed on the emission end of the fly eye lens 610. Thus, the illumination light image $I_3$ incident from the illumination light generating section 500 to the illumination optical system 600 is also reflected in the emission light image $I_4$, which has the illumination distribution of the illumination light L radiated by the illumination optical system 600 on the mask 710.

The projection optical system 700 is disposed directly behind the mask stage 720, and is provided with an aperture stop 730. The aperture stop 730 is disposed at a position that is optically conjugate with the emission end of the fly eye lens 610 of the illumination optical system 600. A substrate stage 820 that holds a substrate 810 coated with a photosensitive material is disposed at the emission end of the projection optical system 700.

The mask 710 held by the mask stage 720 has a mask pattern formed by a region that reflects or transmits the illumination light L emitted by the illumination optical system 600 and a region that absorbs this illumination light L. Thus, by radiating the illumination light image $I_4$ on the mask 710, a projection light image $I_5$ is generated by the interaction between the mask pattern of the mask 710 and the illumination distribution of the illumination light image $I_4$ itself. The projection light image $I_5$ is projected on the photosensitive material of the substrate 810, and forms a resist layer having a desired pattern on the surface of the substrate 810.

In FIG. 44, the optical path of the illumination light L is a straight line; however, it is possible to miniaturize the exposure apparatus 400 by bending the optical path of the illumination light L. In addition, FIG. 44 shows the illumination light L being transmitted through the mask 710; however, a reflecting mask 710 may be used instead.

Figure 46:
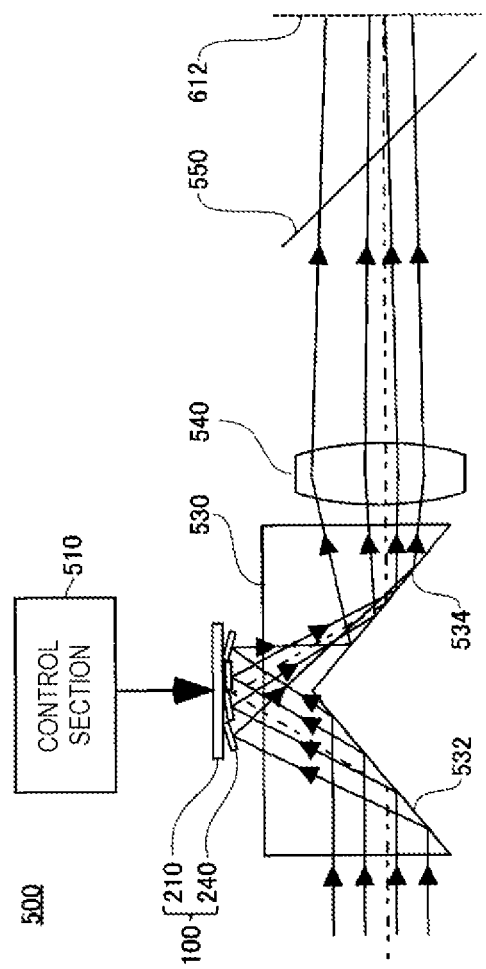
FIG. 46 is a diagram showing an operation of the spatial light modulator 100 in the exposure apparatus 400.

FIG. 46 is a partial enlarged view of the illumination light generating section 500, and shows the role of the spatial light modulator 100 in the exposure apparatus 400. The prism 530 has a pair of reflecting surfaces 532 and 534. The illumination light L incident to the prism 530 is radiated toward the spatial light modulator 100 by one of the reflecting surfaces 532.

As already described above, the spatial light modulator 100 has a plurality of reflecting sections 240 which is able to swing independently. Thus, by having the control section 510 control the spatial light modulator 100, it is possible to form any light source image $I_2$ as desired.

The light source image $I_2$ emitted from the spatial light modulator 100 is reflected by the other reflecting surface 534 of the prism 530, and is emitted from the end of the prism 530 on the right side of the diagram. The light source image $I_2$ emitted from the prism 530 forms the illumination light image $I_3$ on the incident surface 612 of the illumination optical system 600, due to the imaging optical system 540.

While the embodiments of the present invention have been described, the technical scope of the invention is not limited to the embodiments described above. It is apparent to persons skilled in the art that various alterations and improvements can be added to the above-described embodiments. It is also apparent from the scope of the claims that the embodiments with such added alterations or improvements can be included in the technical scope of the invention.

The execution sequence of the operations, procedures, steps, stages, and the like of the apparatuses and systems shown in the claims, specification, or diagrams can be in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the processes must be performed in this order.

What is claimed is:

1. A spatial light modulator comprising:
   a substrate;
   a fixed electrode disposed on a surface of the substrate;
   a connecting section, which has one end of the connecting section connected to the surface of the substrate;
   a movable section, which is connected to another end of the connecting section, and which swings with respect to the substrate due to elastic deformation of the connecting section;
   a supporting post section, which extends in a thickness direction of the substrate with one end of the supporting post section connected to the movable section, and which integrally swings with the movable section;
   a reflecting member, which is connected to another end of the supporting post section, and which has a reflecting surface that integrally swings with the movable section and the supporting post section;
   a movable electrode, which is disposed on a surface of the reflecting member, the surface of the reflecting member facing the fixed electrode; and
   a conductive layer, which is disposed on the supporting post section with a film thickness larger than that of the movable electrode, and which electrically connects between the movable section and the movable electrode.

2. The spatial light modulator according to claim 1, wherein the supporting post section is formed of metal.

3. An exposure apparatus comprising the spatial light modulator according to claim 1.

4. A spatial light modulator comprising:
   a substrate;
   a fixed electrode disposed on a surface of the substrate;
   a connecting section, which has one end of the connecting section connected to the surface of the substrate;
   a movable section, which is connected to another end of the connecting section, and which swings with respect to the substrate due to elastic deformation of the connecting section;
   a reflecting member, which includes a semiconductor layer and which has a reflecting surface that integrally swings with the movable section;
   a metal layer adjacent to the semiconductor layer; and
   an ohmic contact section which creates an ohmic contact between the semiconductor layer and the metal layer, wherein the ohmic contact section is doped with a dopant in at least a part of a region, which is adjacent to the metal layer, and formed on a part of the semiconductor layer.

5. An exposure apparatus comprising the spatial light modulator according to claim 4.

6. A spatial light modulator comprising:
   a substrate;
   a fixed electrode disposed on a surface of the substrate;
   a connecting section, which has one end of the connecting section connected to the surface of the substrate;
   a movable section, which is connected to another end of the connecting section, and which swings with respect to the substrate due to elastic deformation of the connecting section;
   a reflecting member, which includes a semiconductor layer and which has a reflecting surface that integrally swings with the movable section;
   a metal layer adjacent to the semiconductor layer; and
   an ohmic contact section which creates an ohmic contact between the semiconductor layer and the metal layer, wherein the ohmic contact section is doped with a dopant in an entire interface with respect to the metal layer, and formed on a part of the semiconductor layer in a thickness direction.

7. An exposure apparatus comprising the spatial light modulator according to claim 6.

8. A spatial light modulator comprising:
   a substrate;
   a connecting section, which has one end of the connecting section connected to a surface of the substrate;
   a movable section, which is connected to another end of the connecting section, and which swings with respect to the substrate with the connecting section as a swinging axis due to elastic twisting deformation of the connecting section;
   a supporting post section, which extends in a thickness direction of the substrate with one end of the supporting post section connected to the movable section, and which integrally swings with the movable section;
   a reflecting member, which is connected to another end of the supporting post section, and which has a reflecting surface that integrally swings with the movable section and the supporting post section;
   a movable electrode, which is disposed on a surface of the reflecting member, the surface of the reflecting member facing the surface of the substrate; and
   a fixed electrode disposed on the surface of the substrate in a region facing the movable electrode without being blocked by the connecting section and the movable section;
   wherein the movable electrode is situated so as to be drawn toward the fixed electrode by an electrostatic attractive force, so that the reflecting member swings.

9. The spatial light modulator according to claim 8, wherein the fixed electrode includes a plurality of regions which are electrically insulated from each other and which have symmetrical shapes to each other.

10. The spatial light modulator according to claim 9, wherein the fixed electrode includes a plurality of regions which have a same shape as each other.

11. An exposure apparatus comprising the spatial light modulator according to claim 8.

* * * * *